United States Patent
Tseng

[19]

[11] Patent Number: 5,977,953
[45] Date of Patent: Nov. 2, 1999

[54] MECHANIC ENCODER HAVING SINGLE CONDUCTORS RING

[76] Inventor: Hsin-Te Tseng, 4F, No. 19, Shih-Chien St., Pei-Tou, Taipei, Taiwan

[21] Appl. No.: 08/955,925

[22] Filed: Oct. 22, 1997

[51] Int. Cl.[6] ....................................................... G09G 5/08
[52] U.S. Cl. .......................... 345/164; 345/163; 345/157; 345/167
[58] Field of Search .................................. 345/156–167; 341/20, 35

[56] References Cited

U.S. PATENT DOCUMENTS

| | | | |
|---|---|---|---|
| 5,027,109 | 6/1991 | Donovan et al. | 345/165 |
| 5,168,268 | 12/1992 | Levy | 345/165 |
| 5,555,004 | 9/1996 | Ono et al. | 345/161 |
| 5,805,141 | 9/1998 | Hsu | 345/161 |

*Primary Examiner*—Bipin H. Shalwala
*Assistant Examiner*—Kent Chang
*Attorney, Agent, or Firm*—Rosenberg, Klein & Bilker

[57] ABSTRACT

A mechanic encoder having a single conductors ring is provided. The arrangement between the a first and a second conducting fingers and the conductors ring are specially arranged such that the sequential signal pairs can be accurately and precisely generated, i.e. the resolution is accordingly increased. The conductors ring is configured by a plurality of conducting plates which are aligned with the center of the encoding wheel or in an alternative, those conducting plates are offset from the center of the center of the encoding wheel. The conductors ring is configured with a plurality of conducting portions and insulating portions which are alternatively contacted with the conducting fingers. The encoding wheel is powered by a third conducting finger and a sequential signal pairs can be detected from the output of the first and second conducting fingers. The signal pairs can be further processed and recognized to determine the rotation of the encoding wheel. Even a tiny movement or rotation of the encoding wheel, a signal pairs can be detected. By this arrangement, the resolution is increased.

3 Claims, 12 Drawing Sheets

MECHANIC ENCODER HAVING SINGLE CONDUCTORS RING

FIELD OF THE INVENTION

The present invention relates to a mechanic encoder, more particularly, to a mechanic encoder having a single conductors ring in which the rotational directional and the rotating angle of the encoding wheel can be increased.

Description of Prior Art

FIGS. 1A and 1B has disclosed a conventional mechanic encoder which is configured by an encoding wheel 01, a plurality of conducting fingers 02, 03 and 04. As shown in FIG. 2, the encoding wheel 01 is provided with two concentric conductors rings 012 and 013 which are arranged along the center 014 of the encoding wheel 01. Those conductors rings 012 and 013 are respectively and electrically contacted with those conducting fingers 02, 03 and 04 which are connected with a power supply (not shown). When the encoding wheel 01 is rotated, those conducting fingers 02 and 03 may output a voltage signal with different levels and these voltage signals can be represented by different waveforms 2A and 3A in FIG. 3. Consequently, those output can be used to control the position of a cursor. However, this conventional encoder can be concluded with the following defects.

1. Those two conductors rings 012 and 013 shall be offset from each other and only by this a plurality of encoding signals can be attained. However, this will waste a lot of space and the number of resulted signals pair is reduced.

(2) The conducting fingers 02 and 03 have different radii as centered on the rotating shaft of the encoding wheel. As a result, when the encoding wheel 01 is rotated, those conducting fingers 02 and 03 will have a different relative speed with the encoding wheel 01. As a result, some unwanted waveforms 2B and 3B will be resulted from the bounce between the conducting fingers and the conductors rings and which are not good for the resulted signals pair. In order to screen out these unwanted waveforms 2B, 3B, a debouncer circuit shall be built-in. However, this will bring a negative on the manufacturing since it shall be specially and individually adjusted during the manufacturing. Another measurement is to change the ration between the conductors rings such that the ration between the bounce waveform and the normal waveform is compressed. However, this measurement will bring a negative influence to the resolution which is already poor.

SUMMARY OF THE INVENTION

It is the objective of this invention to provide a mechanic encoder in which the rotational directional and the rotating angle of the encoding wheel can be increased.

According to one aspect of the present invention, the debounce circuit is electrically connected at the output terminal such that the adjustment of the debounce circuit can be conveniently performed.

In order to achieve the object set forth, an encoding wheel is provided with a plurality of conducting plates which are jointly defined a conductors ring. A conducting fingers set is also provided and which is configured by at least a first, a second and a third conducting fingers. The first and second conducting fingers are electrically contacted with the conductors ring which is divided into a plurality of conducting portions and insulating portions which are alternatively arranged. A third conducting finger is electrically connected with a power supply which in turn provides the power to the encoding wheel. Wherein once the encoding wheel is rotated and powered up, a sequential signal pairs will be detected from the output of the first and second conducting fingers. Those sequential signal pairs can be further processed for controlling other equipment, such as a cursor.

According to one aspect of the present invention, the conducting plates are offset from the center of the encoding wheel.

BRIEF DESCRIPTION OF THE DRAWINGS

In order that the present invention may more readily be understood the following description is given, merely by way of example with reference to the accompanying drawings, in which.

DETAILED DESCRIPTION OF PREFERRED EMBODIMENT

Figure 1A:
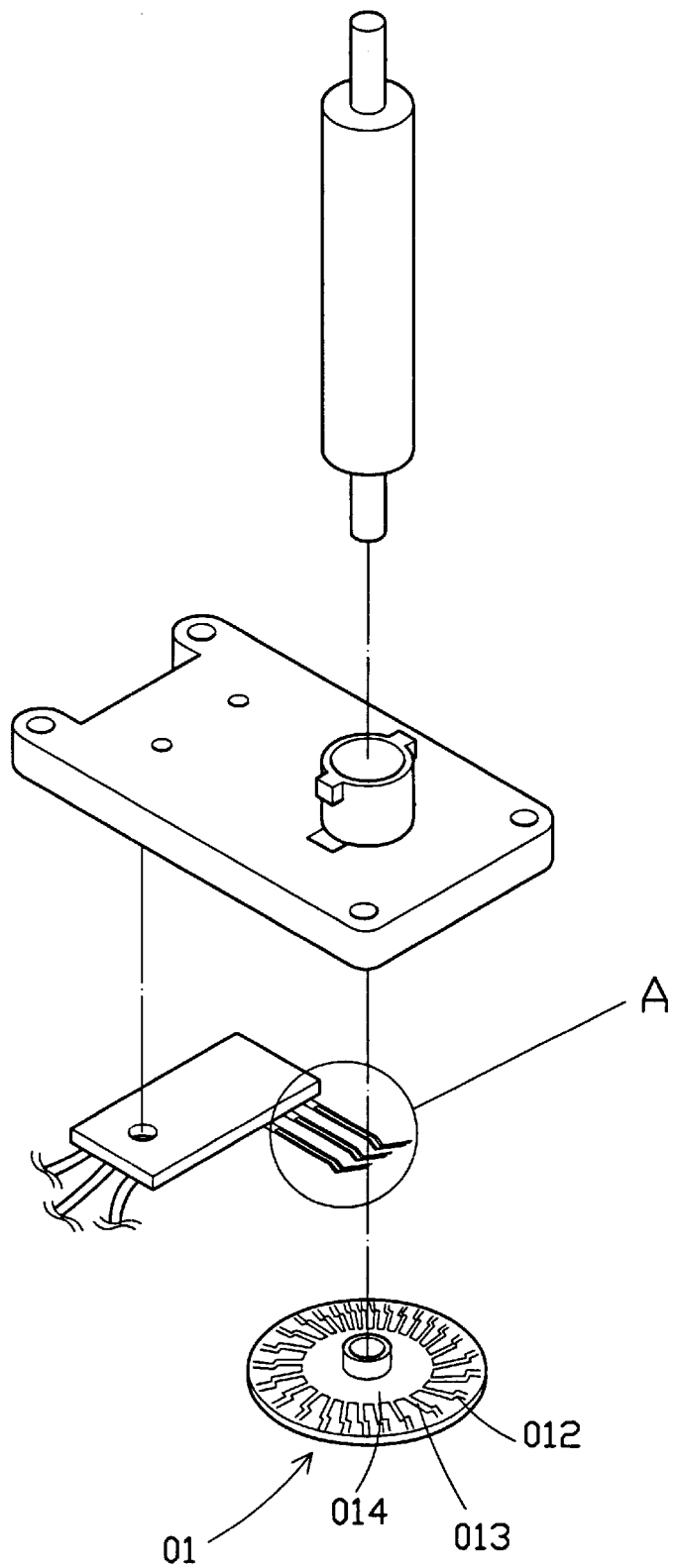
FIGS. 1A and 1B is an exploded perspective view of a conventional mechanic encoder.
Figure 1B:
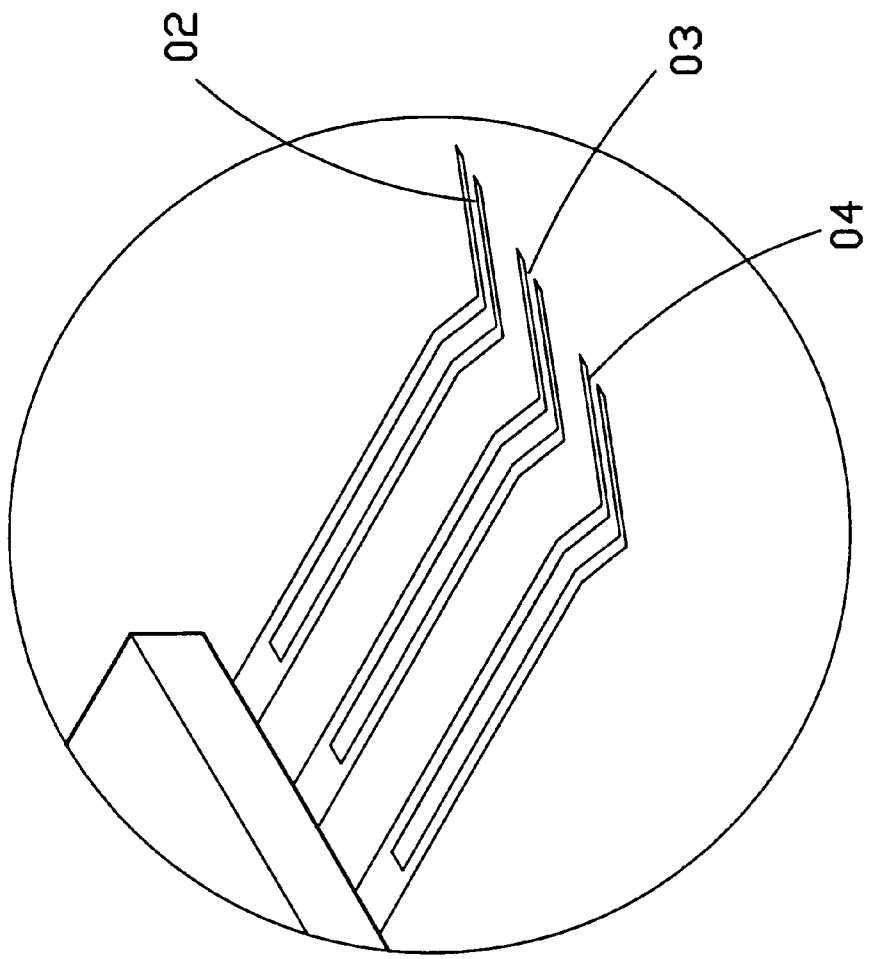
Figure 2:
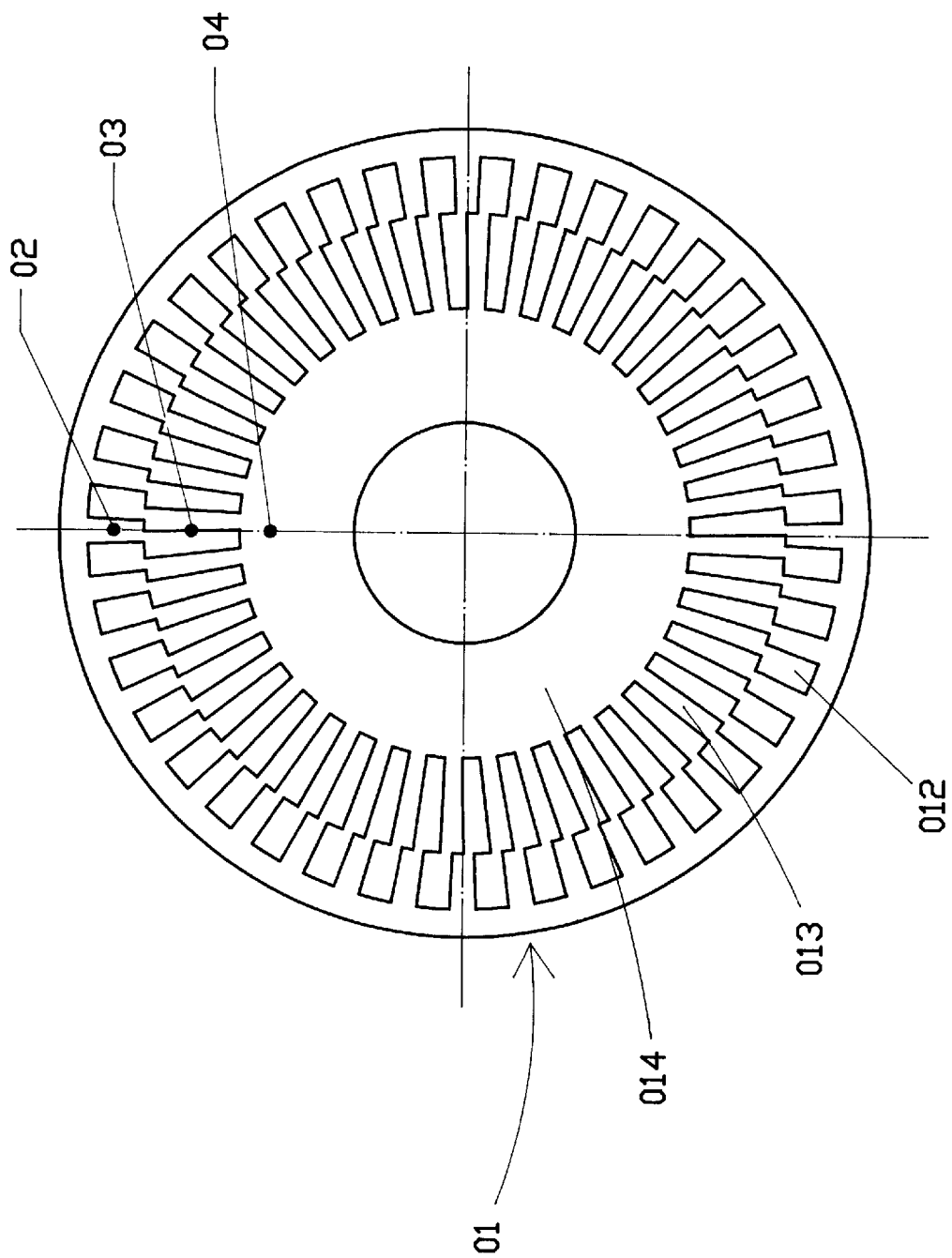
FIG. 2 is schematic illustration showing the arrangement between the encoding wheel and the conducting fingers.
Figure 3:
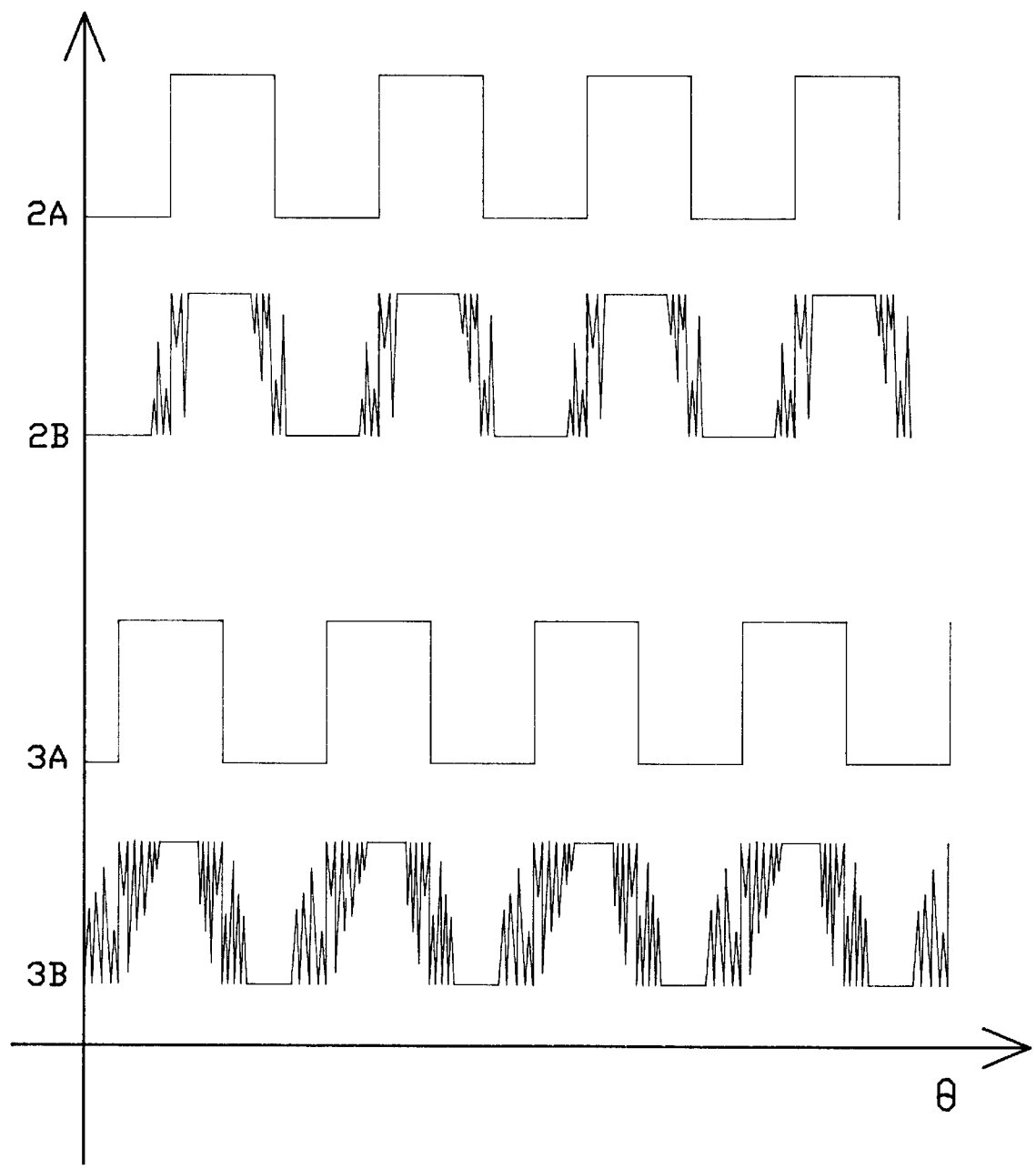
FIG. 3 is a signal graph resulted from the conducting fingers.
Figure 4:
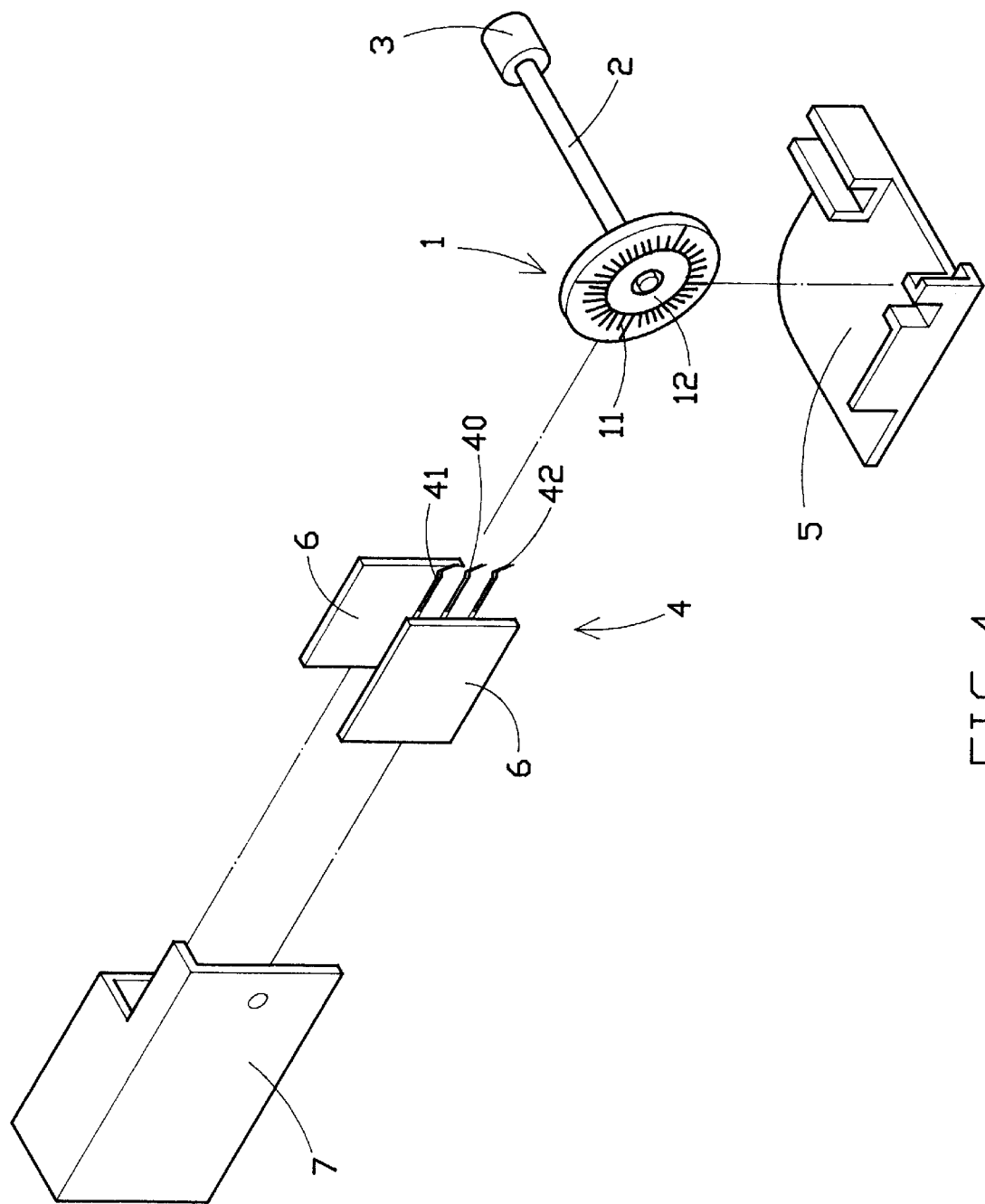
FIG. 4 is an exploded perspective view of the mechanic encoder made according to the present invention.

Referring to FIGS. 4 to 8, the mechanic encoder having single conductors ring made according to the present invention generally comprises a encoding wheel 1, a mounting socket 5, a pair of clipping plates 6, a mounting bracket 7 and a plurality of conducting fingers set 4.

The encoding wheel 1 is provided with a plurality of conducting plates which are radially arranged such that a conductors ring 11 is formed respective to an annular portion 12. The conductors ring 11 is configured by a plurality of conducting portions 111 and insulating portion 112 which are alternatively arranged. The conducting portion 111 has a greater conductivity over the insulating portion 112. The encoding wheel 1 is fixedly attached to one end of a shaft 2 with its shaft hole at center. The opposite end of the shaft 2 is fixedly disposed with a roller 3. As a result, the shaft 2 can be rotationally mounted onto the mounting socket 5 together with the encoding wheel 1 and the roller 3.

Those pair of clipping plates 6 are fixedly connected to the mounting bracket 7 and those clipping plates 6 are spaced apart from each other such that the encoding wheel 1 can be rotationally arranged therebetween. One of the clipping plates 6 is disposed with a plurality of conducting fingers set 4 which, in this preferable embodiment, includes three conducting fingers 41, 42 and 43. Those three conducting fingers set 4 is specially arranged such that the conducting fingers 41 and 42 are respectively contacted with the conductors ring 11 and the other conducting finger 43 is in contact with the annular portion 12.

The conducting finger 43 is electrically connected to a power supply and consequently the encoding wheel 1 can be supplied with power. On the other hand, those two conducting fingers 41 and 42 are respectively contacted with the conducting portion 111 and/or insulating portion 112 such that at least four different signal pairs can be generated.

Figure 5:
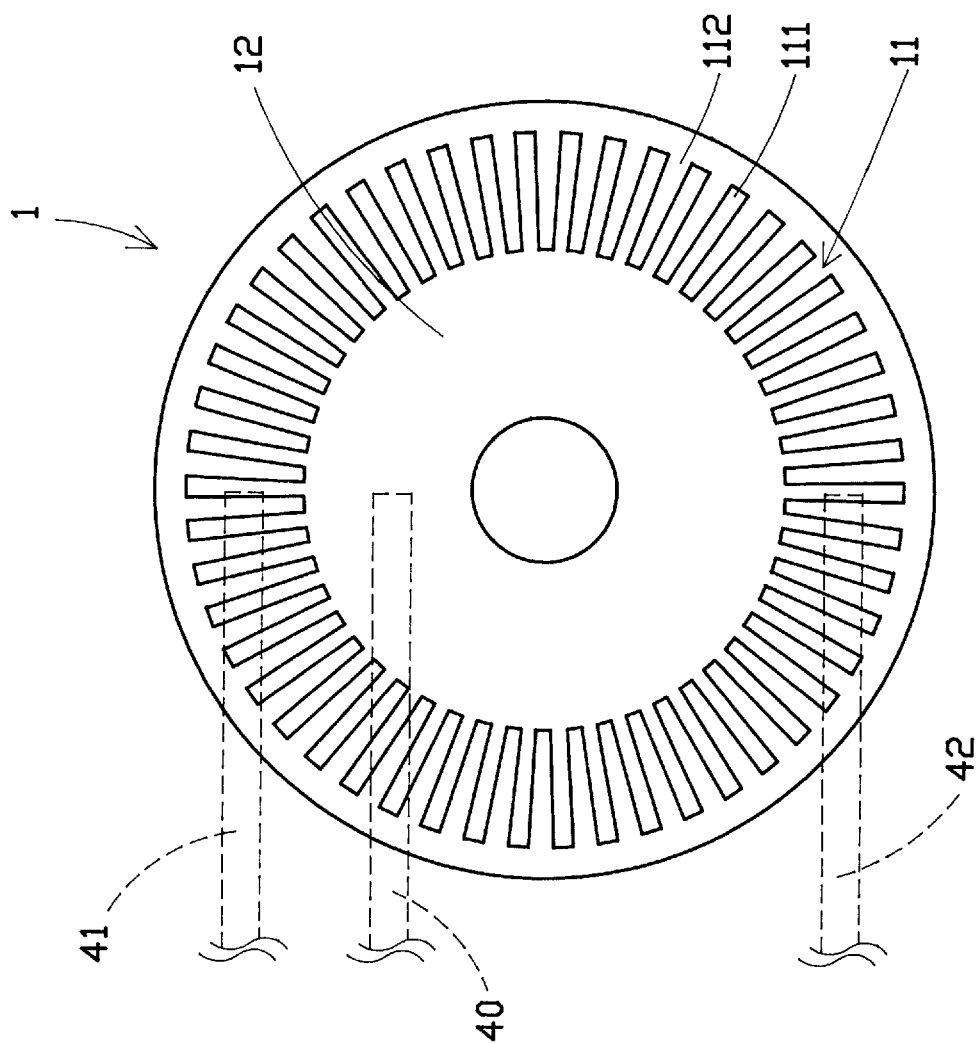
FIG. 5 is a schematic illustration showing the operation of the mechanic encoder.
Figure 6:
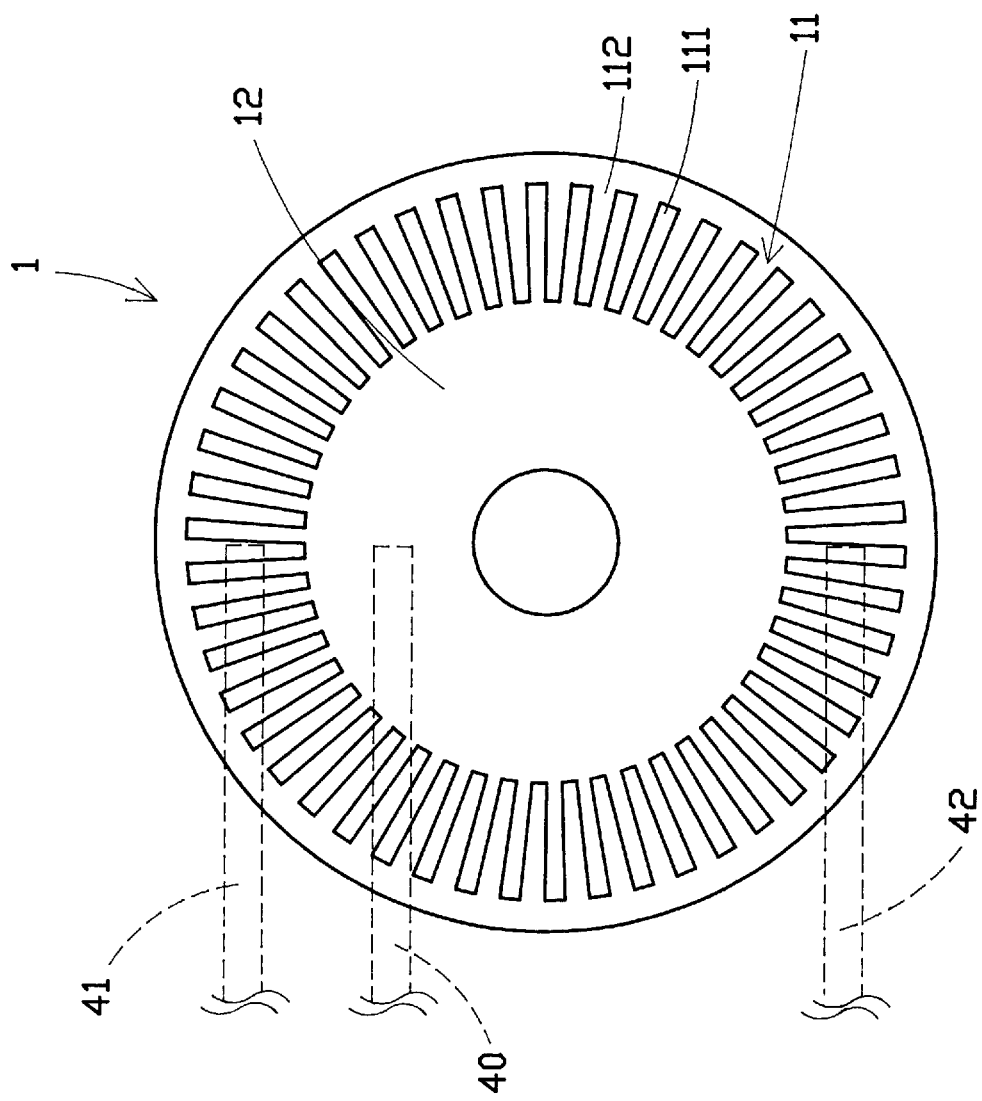
FIG. 6 is still a schematic illustration showing the operation of the mechanic encoder.
Figure 7:
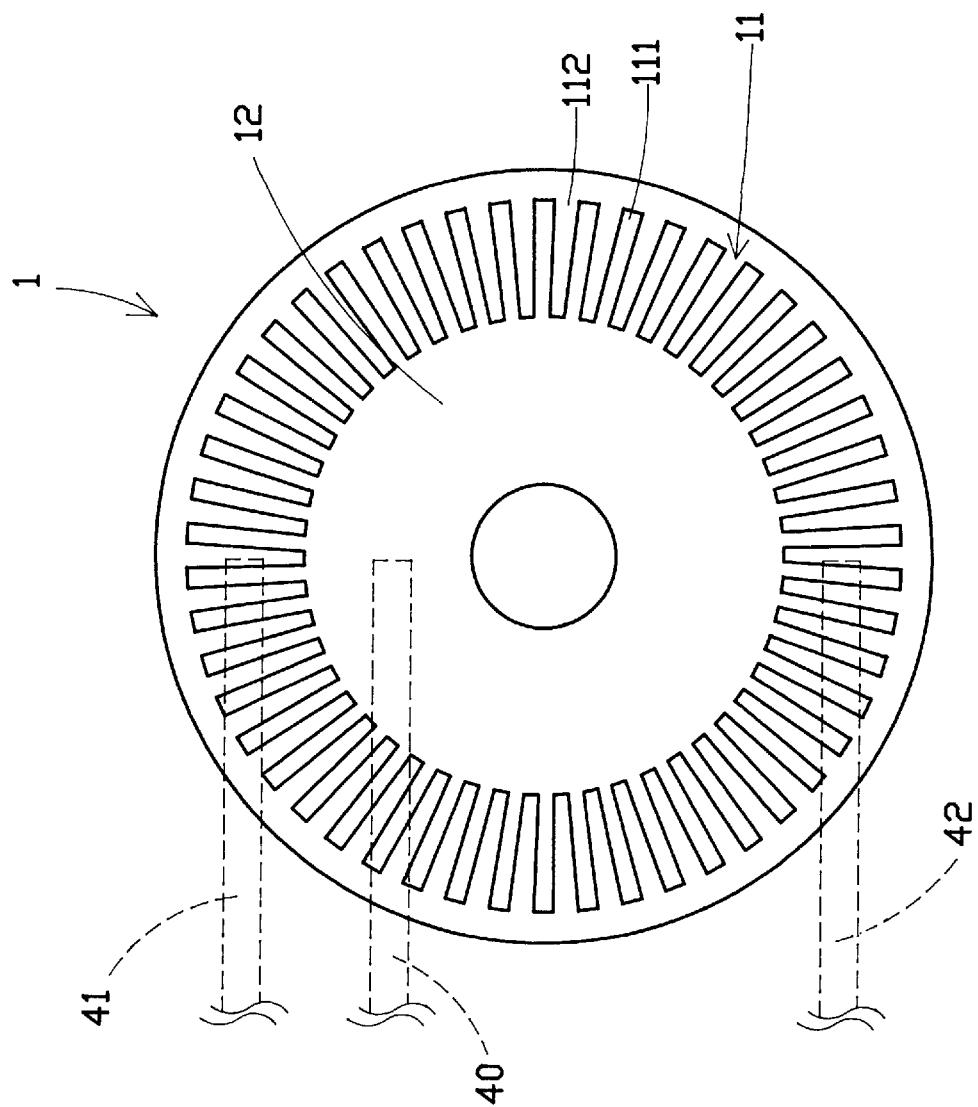
FIG. 7 is yet still a schematic illustration showing the operation of the mechanic encoder.

For example, when both the conducting fingers 41 and 42 are electrically contacted with the conducting portions 111 of the encoding wheel 1, a signal pair (1, 1) can be generated, as clearly shown in FIG. 5.

When the conducting fingers 41 and 42 are electrically contacted with the insulating portions 112 and conducting portions 111 of the encoding wheel 1 respectively. Accordingly, a signal pair (0, 1) is generated, as clearly shown in FIG. 6.

When the conducting fingers 41 and 42 are electrically contacted with the conducting portions 111 and insulating portions 112 of the encoding wheel 1 respectively. Accordingly, a signal pair (1, 0) is generated, as clearly shown in FIG. 7.

Figure 8:
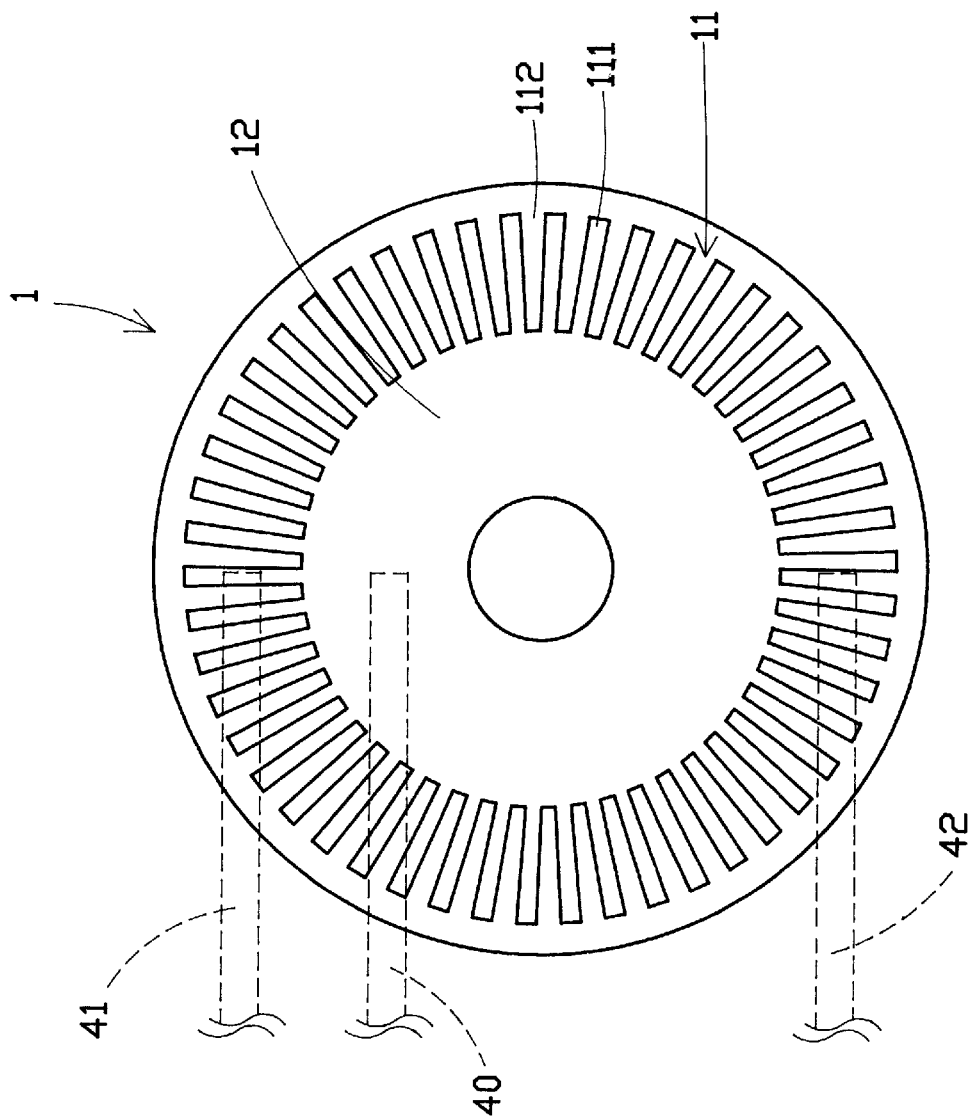
FIG. 8 is yet another schematic illustration showing the operation of the mechanic encoder.
Figure 9:
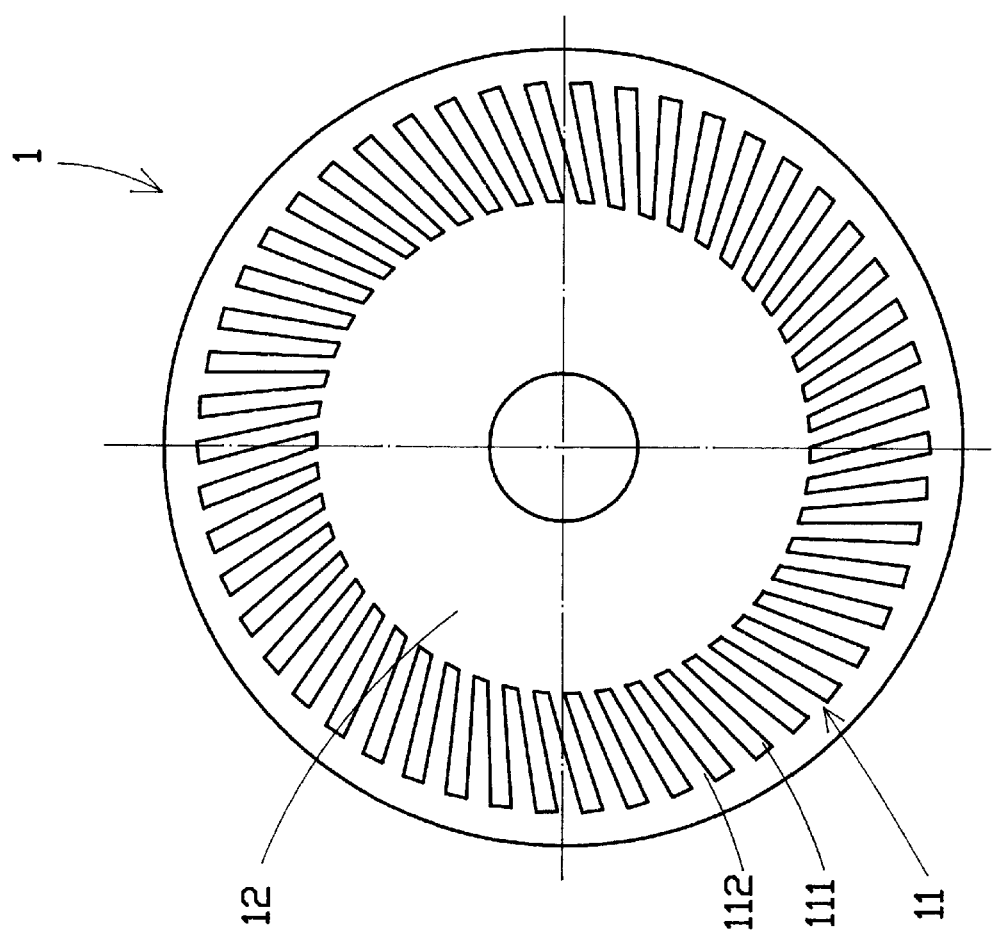
FIG. 9 is a front view of another encoding wheel made according to the present invention.

When both the conducting fingers 41 and 42 are electrically contacted with the insulating portions 112 of the encoding wheel 1, a signal pair (0, 0) can be generated, as clearly shown in FIG. 8.

When the encoding wheel 1 is rotated in clockwise, the signal pairs (1, 1; 0, 1; 1, 0; 0,0) will be repetitively generated as long as the encoding wheel 1 is rotated. To the contrary, when the encoding wheel 1 is rotated in counterclockwise, the signal pairs (0,0; 1,0; 0,1; 1,1) will be repetitively generated as long as the encoding wheel 1 is rotated. Accordingly, from the signal pairs and sequence detected by the downstream detecting circuit, the rotating angle of the encoding wheel 1 can be readily recognized. Even a minor rotation, a signal pair can still be generated and detected. As a result, the resolution is increased.

Since the length of the conducting fingers 41 and 42 have equal length, the contacting points between the fingers 41 and 42 with the encoding wheel 1 have the same radius. Consequently, the debounce circuit which is electrically connected at the output terminal of the encoder can be readily and conveniently adjusted.

Figure 10A:
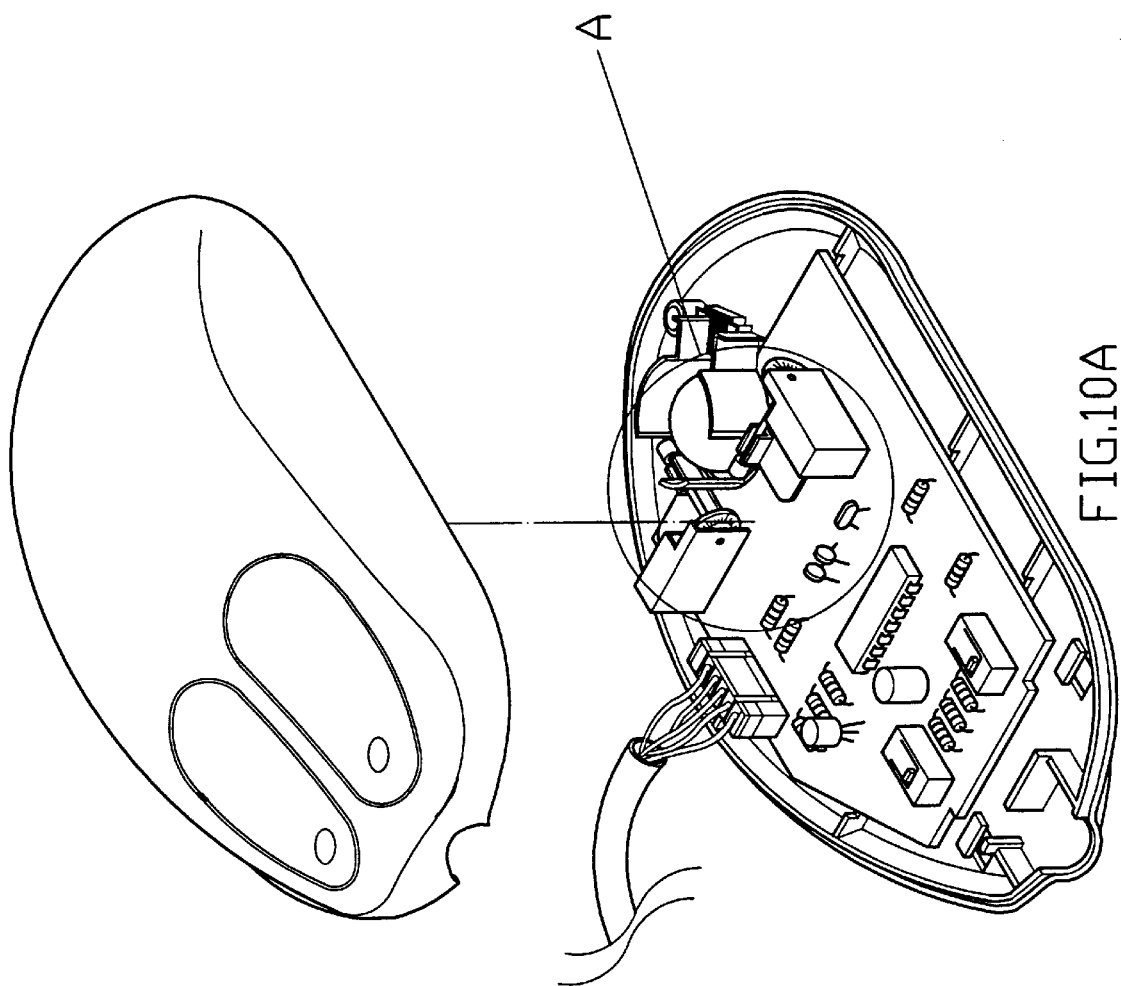
FIG. 10A is a schematic illustration showing the operation of the mechanic encoder.
Figure 10B:
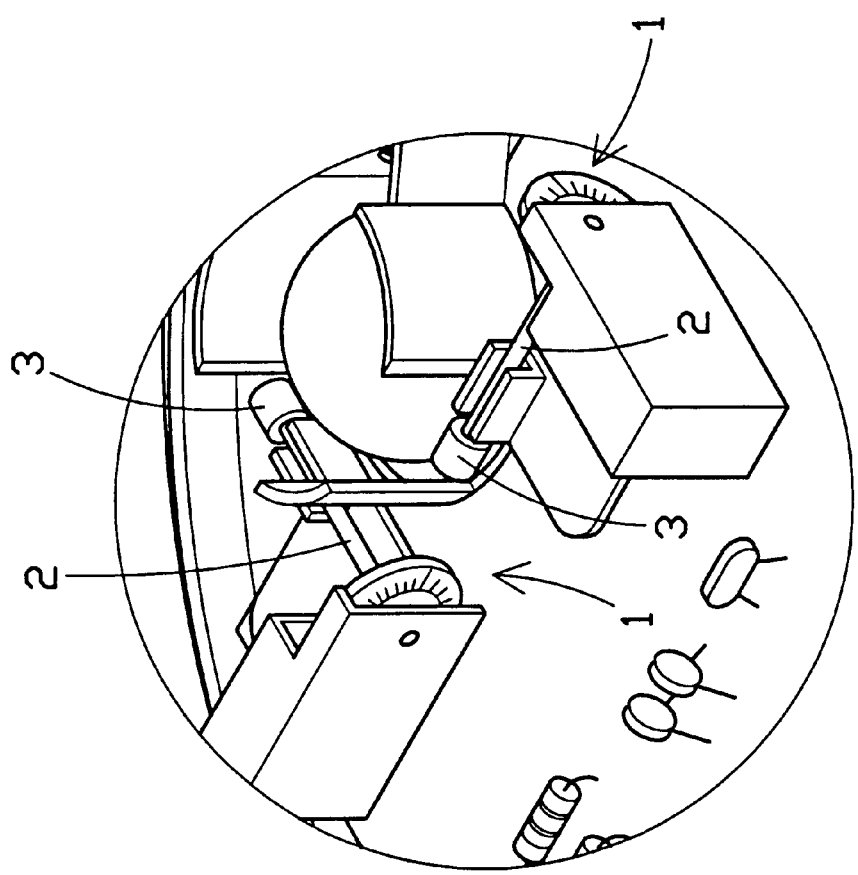
FIG. 10B is an enlarged view of the part encircled in FIG. 10.

Referring to FIG. 10, when the encoder is installed onto the mouse, the cursor on the screen can be accurately and precisely controlled by the mouse because even a tiny movement can be readily transmitted to the encoding wheel through the tracing ball within the mouse.

In another feasible embodiment, the shaft of the encoding wheel can be rotated manually with finger or a small motor for adjusting the vertical, horizontal alignment of the screen of a monitor. It can be also used to control the volume, balance, tone and base of an audio set.

From the forgoing description, it can be readily appreciated that a sequential signal pairs can be repetitively generated by the mechanic encoder having a single conductors ring in an accurate and precise manner. Even a tiny movement or rotation of the encoding wheel, a signal pair or pairs can be readily generated for further processing. The defects have been completely solved by the provision of the present invention.

While particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

I claim:

1. A mechanic encoder having a single conductors ring, comprising an encoding wheel and a conducting fingers set, said encoding wheel being provided with a plurality of conducting plates which are radially arranged such that a conductors ring is defined on said encoding wheel, said conducting plates being configured by a plurality of conducting portions and a plurality of insulating portions which are alternatively disposed from each other, said conducting fingers set being configured with a first, second and third conducting fingers and said first and second conducting fingers being electrically contacted with said conducting portion and/or insulating portion respectively, a third conducting finger being electrically connected to a power supply, wherein when said encoding wheel is powered by said third conducting finger, a sequential signals can be detected from the output of said two conducting fingers which are electrically contacted with said conducting portion and/or insulating portion respectively.

2. A mechanic encoder having a single conductors ring as recited in claim 1, wherein the contacting points between said first and second conducting fingers and said conductors ring have the same radius to the center of said encoding wheel.

3. A mechanic encoder having a single conductors ring as recited in claim 1, wherein said conducting plates of said conductors ring can be made with an elongate shape and each of said conducting plate is offset from the center of said encoding wheel.

* * * * *